United States Patent [19]
Knaack

[11] Patent Number: 5,898,315
[45] Date of Patent: Apr. 27, 1999

[54] OUTPUT BUFFER CIRCUIT AND METHOD HAVING IMPROVED ACCESS

[75] Inventor: Roland T. Knaack, Starkville, Miss.

[73] Assignee: Cypress Semiconductor Corp., San Jose, Calif.

[21] Appl. No.: 08/649,302

[22] Filed: May 17, 1996

[51] Int. Cl.$^6$ ............................................. H03K 19/0185
[52] U.S. Cl. .................... 326/17; 326/27; 326/86
[58] Field of Search .................. 326/17, 21, 27–28, 326/86–87

[56] References Cited

U.S. PATENT DOCUMENTS

| | | | |
|---|---|---|---|
| 4,636,983 | 1/1987 | Young et al. | 365/181 |
| 4,885,485 | 12/1989 | Leake et al. | 307/542 |
| 5,013,940 | 5/1991 | Ansel | 307/473 |
| 5,036,222 | 7/1991 | Davis | 326/27 |
| 5,329,175 | 7/1994 | Peterson | 326/27 |
| 5,450,019 | 9/1995 | McClure et al. | 326/28 |
| 5,455,521 | 10/1995 | Dobbelaere | 326/17 |
| 5,534,806 | 7/1996 | Gowni et al. | 327/170 |
| 5,537,060 | 7/1996 | Baek | 326/27 X |
| 5,559,465 | 9/1996 | Shah | 327/374 |
| 5,600,261 | 2/1997 | White et al. | 326/27 |
| 5,623,216 | 4/1997 | Penza et al. | 326/27 |
| 5,623,221 | 4/1997 | Miyake | 326/27 X |
| 5,633,600 | 5/1997 | Ohnishi | 326/17 |

OTHER PUBLICATIONS

Arcole; U.S.S.N. 08/777488 Memory Having Selectable Output Strengths; filed Dec. 30, 1996.

*Primary Examiner*—Jon Santamauro
*Attorney, Agent, or Firm*—Christopher P. Maiorana; Maiorana & Acosta, P.C.

[57] ABSTRACT

The present invention concerns a circuit and method for improving the data access times across boundary reads between cascaded buffers, such as FIFOs, that are connected to a common data output bus. The circuit allows read accesses within a cascaded buffer system to have similar access speeds, i.e., a boundary read is not noticeably slower or faster than any other non-boundary read access from an individual buffer in the system. The circuit may not adversely affect the data sheet or operating system parameters, and imposes minimal chip real estate constraints.

22 Claims, 6 Drawing Sheets

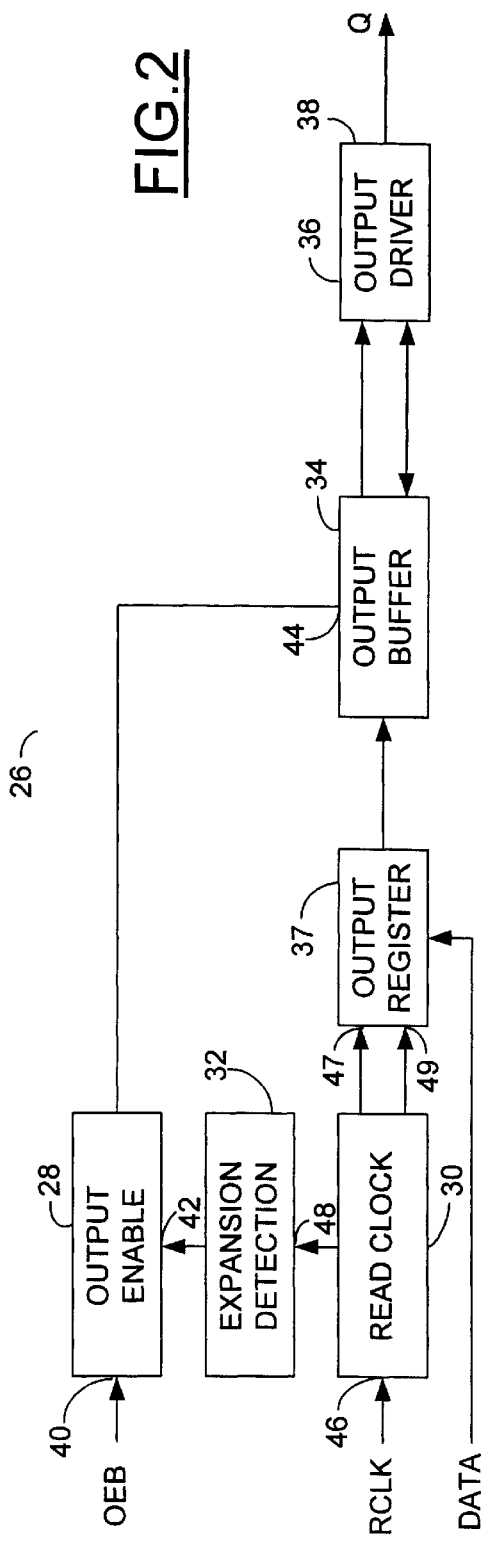
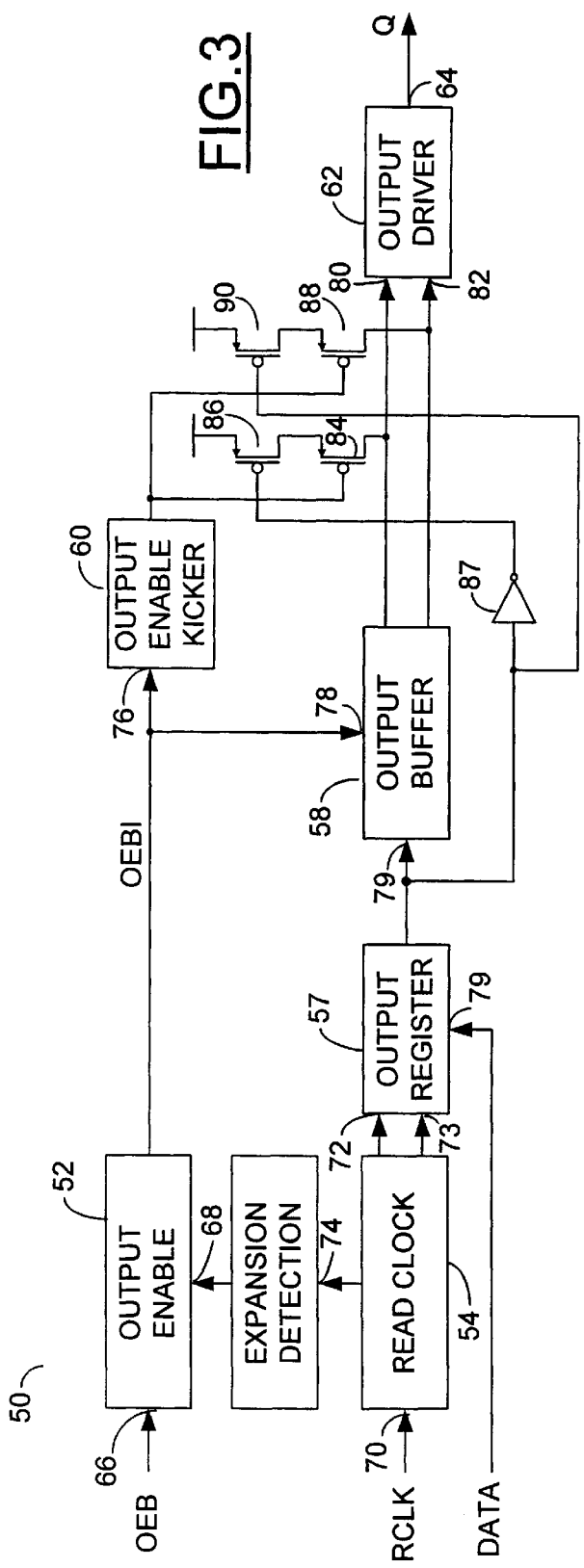

5,898,315

OUTPUT BUFFER CIRCUIT AND METHOD HAVING IMPROVED ACCESS

FIELD OF THE INVENTION

The present invention generally relates to a circuit and a method that can be used to improve access time and more particularly, to a circuit and a method that can be used for improving access time in a configuration where one or more buffers are cascaded together to drive a common output bus.

BACKGROUND OF THE INVENTION

Access times are important in memory devices, such as first-in first-out (FIFO) buffers, where one device discontinues the driving of a common data output bus as a second device begins the driving of the common data output bus. FIG. 1 illustrates a circuit 10 implementing such a configuration. The circuit 10 generally comprises a first FIFO 12 and a second FIFO 14. The first FIFO 12 has an input 16 that receives an output enable signal OEB and an input 18 that receives a read clock signal RCLK. The second FIFO 14 has an input 20 that receives the output enable signal OEB and an input 22 that receives the read clock signal RCLK. Both the first FIFO 12 and the second FIFO 14 present data to the common data output bus 24. With a standard read data access, the common data output bus 24 quickly responds to either the first FIFO 12 or the second FIFO 14. When two successive read data accesses cross the boundary between the first FIFO 12 and the second FIFO 14, an internal read clock signal and an internal output enable signal generally make a transition between the first FIFO 12 and the second FIFO 14. The output enable signal OEB is active throughout the transition. As a result, there is a longer path from the read clock signal RCLK to the common data output bus 24 during a read data access that crosses the boundary as compared to a normal read data access that does not cross the boundary. As the speed of the FIFOs increases (e.g., in excess of 100 MHz with 8 ns data access times) the problem associated with reads that cross physical device boundaries increases.

FIG. 2 shows the output circuitry 26 contained in each of the first FIFO 12 and the second FIFO 14 shown in FIG. 1. The output circuitry 26 generally comprises an output enable block 28, a read clock block 30, an expansion detection block 32, an output buffer 34, an output driver 36, an output register 37 and an output 38. The output enable block 28 receives the output enable signal OEB at an input 40 and receives a signal from the expansion detection block 32 at an input 42. The output enable block 28 presents a signal to an input 44 of the output buffer 34. The read clock block 30 receives the read clock signal RCLK at an input 46 and presents an output to both an input 47 and an input 49 of output register 37 as well as to an input 48 of the expansion detection block 32. The output buffer 34 presents a signal PU and a signal PD to the output driver 36. The output driver 36 presents an output signal Q at the output 38 that is presented to the common data output bus 24 in FIG. 1.

SUMMARY OF THE INVENTION

The present invention provides a circuit and method for improving the data access times across boundary reads between cascaded buffers, such as FIFOs, that are connected to a common data output bus. The circuit allows read accesses within the cascaded buffer system to have similar access speeds. In other words, the boundary read accesses (i.e. read accesses crossing two cascaded buffers) are generally not noticeably slower or faster than non-boundary read accesses from an individual buffer in the system. The circuit preferably (a) does not adversely affect the data sheet or operating system parameters and (b) consumes a minimum amount of chip real estate.

The objects, features and advantages of the present invention include (a) improved boundary read access times between cascaded buffers connected to a common data output bus, (b) read accesses (preferably all read accesses) within the cascaded buffer system that appear at similar rates and/or speeds, (c) little or no adverse effects on the performance of other operating parameters and (d) consumption of very little additional chip real estate.

BRIEF DESCRIPTION OF THE DRAWINGS

These and other objects, features and advantages of the present invention will be apparent from the following detailed description and the appended claims and drawings in which:

FIG. 2 is a block diagram of the output circuitry of the cascaded FIFOs of FIG. 1;

FIG. 3 is a block diagram of a preferred embodiment of the present invention output circuit;

DETAILED DESCRIPTION OF THE PREFERRED EMBODIMENTS

Figure 1:
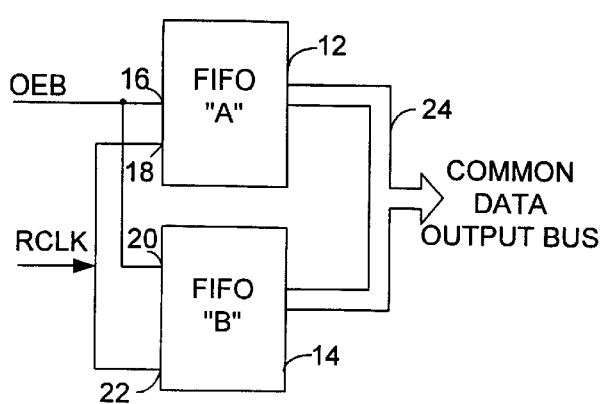
FIG. 1 is a block diagram illustrating two FIFO buffers cascaded together and connected to a common data output bus.

Referring to FIG. 3, an output circuit 50 is shown in accordance with a preferred embodiment of the present invention. The output circuit 50 generally comprises an output enable block 52, a read clock block 54, an expansion detection block 56, an output register 57, an output buffer 58, an output enable kicker block 60, an output driver block 62 and an output 64. The output enable block 52 has an input 66 that may receive an output enable signal OEB and an input 68 that may receive a signal from the expansion detection block 56. The read clock block 54 has an input 70 that may receive a read clock signal RCLK. The read clock block 54 may present a signal to either or both of inputs 72 and 73 of the output register block 57 as well as to an input 74 of the expansion detection block 56. The output enable block 52 may present a signal to an input 76 of the output enable kicker block 60 as well as to an input 78 of the output buffer block 58. The output buffer block 58 may receive an output DATAI at an input 79 and may present a pull-up signal PU to an input 80 as well as a pull-down signal PD to an input 82 of the output driver block 62. The output 77 of the output enable kicker block 60 represents a kick signal OEKICK which presents a signal to the gate of a transistor 84. The drain of the transistor 84 is generally coupled to the input 80 of the output driver block 62. The source of the transistor 84 is generally connected to the drain of a transistor 86. The gate of the transistor 86 generally receives an output DATAI from the output register block 57 through an inverter 87. The source of the transistor 86 is generally connected to an input supply voltage (not shown). The output 77 of the output enable kicker block 60 is also generally presented to the gate of a transistor 88. The drain of the transistor 88 is generally coupled to the input 82 of the output driver block 62. The source of the transistor 88 is generally coupled to the drain of a transistor 90. The source of the transistor 90 is generally coupled to an input supply voltage (not shown). The gate of the transistor 90 generally receives the output DATA1 from the output register block 57. The kick signal OEKICK generally triggers the transistors 84, 86, 88 and 90 which in turn provide an enhanced voltage rise time signal at the inputs 80 and 82 of the output driver block 62. The output driver block 62 generally presents a signal at the output 64 that may be connected to the output bus 24. The transistors 84, 86, 88 and 90 are shown to be implemented as PMOS transistors. Other topologies may be substituted to meet the design criteria of a particular application.

The FIFO buffers (or devices) to be cascaded (e.g., the FIFO buffers 12 and 14) can also be implemented as static random access memories (SRAMs), content addressable memories (CAMs), CACHE memories, dynamic random access memories (DRAMs), TAG memories, dual port memories or any other type of memory array having a similar function. The number of cascaded devices to be connected to the common data output bus can be any number necessary to fit the design criteria of a particular application. The FIFO buffers 12 and 14 are referenced as an illustration of an implementation where the present invention may be utilized. Other implementations, including cascading more than two devices together, may be implemented without departing from the spirit of the present invention.

Figure 4:
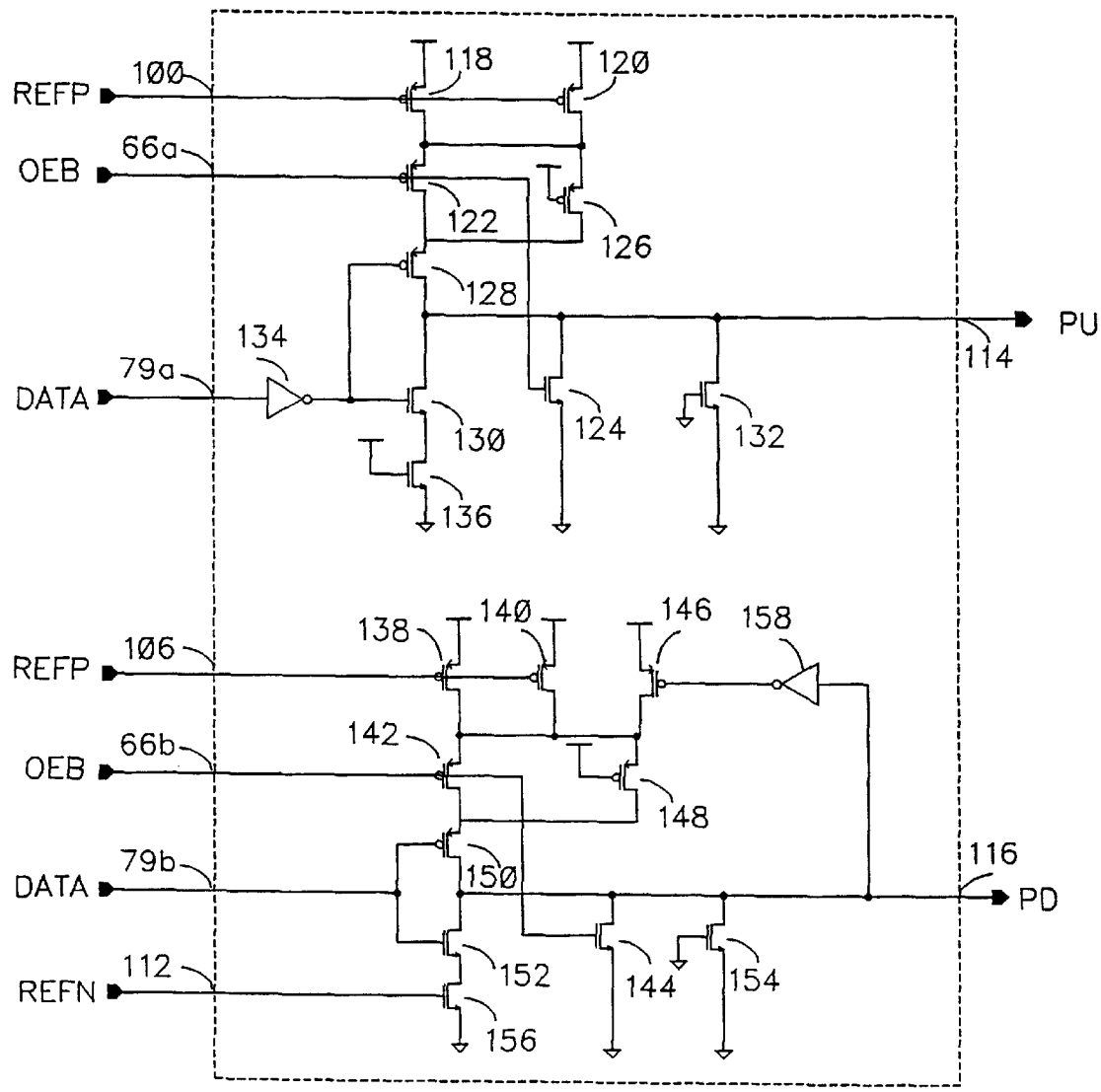
FIG. 4 is a schematic diagram of the output buffer shown in FIG. 3.

Referring to FIG. 4, an example of a circuit diagram of the output buffer block 58 is shown. The output buffer block 58 generally comprises an input 100, an input 66a, an input 66b, an input 79a, an input 79b, an input 106 and an input 112. The output buffer block 58 generally presents an output 114 that represents the signal PU and an output 116 that represents the signal PD. The input 100 represents a signal REFP which may be externally generated. For example, the signal REFP may be about 2.5 volts in a 5 volt system. The signal REFP may be an external reference voltage that may be designed for a particular slew rate control. As a result the signal REFP generally controls the current at the output 114 and 116 for a rising signal transition. The signal REFP connected in the configuration shown in FIG. 4 may be too slow for operation in a cascaded buffer arrangement where the read data access over the boundary condition is preferred to be comparable with the non-boundary read data accesses. The input 106 also receives the signal REFP. The inputs 79a and 79b each receive data from the output register 57. The input 112 receives a signal REFN which is generally similar to the signal REFP. The signal REFN generally feeds n-channel devices while the signal REFP generally feeds p-channel devices. The REFN signal generally controls the current at the output 116 for a falling signal transition.

The input 100 may be received at the gate of a transistor 118 as well as at the gate of a transistor 120. The input 66a is generally received at the gate of a transistor 122 as well as at the gate of a transistor 124. The drain of the transistor 118 is generally coupled to the source of the transistor 122, the source of a transistor 126 and the drain of transistor 120. The drain of the transistor 122 is generally connected to the source of the transistor 128 as well as to the drain of the transistor 126. The drain of the transistor 128 is generally coupled to the source of the transistor 130, the source of the transistor 124, the source of a transistor 132 and the output 114. The input 79a is generally received by an inverter 134. The output of the inverter 134 is generally presented to the gate of the transistor 128 as well as to the gate of a transistor 130. The drain of the transistor 130 is generally connected to the source of a transistor 136. The drain of the transistor 136, the drain of the transistor 124 and the drain and gate of the transistor 132 are generally connected to ground. The source of the transistor 118, the source of the transistor 120, the gate of the transistor 126 and the gate of the transistor 136 are generally coupled to an input supply voltage (not shown). The gate of the transistor 136 may alternatively be coupled to the signal REFN received at the input 112.

The input 106 is generally presented to the gate of a transistor 138 as well as to the gate of a transistor 140. The input 66b is generally presented to a gate of a transistor 142 as well as to a gate of a transistor 144. The drain of the transistor 138 is generally coupled to the source of the transistor 142, the drain of the transistor 140, the drain of a transistor 146 and the source of a transistor 148. The drain of the transistor 148 may be coupled to the drain of the transistor 142 as well as to a source of a transistor 150. The gate of the transistor 150 receives data from the input 79b. The gate of a transistor 152 may also receive the input 79b. The drain of the transistor 150 is generally coupled to the source of the transistor 152, the source of the transistor 144, the source of a transistor 154, the output 116 and to an input of an inverter 158. The drain of the transistor 152 is generally coupled to the source of the transistor 156. The drain of the transistors 144, 154 and 156 and the gate of transistor 154 are generally coupled to ground. The source of the transistors 138, 140, 146 and the gate of the transistor 148 are generally coupled to an input supply voltage (not shown). The output of the inverter 158 is generally coupled to the gate of the transistor 146. The gate of the transistor 156 is generally connected to the input 112.

Figure 5:
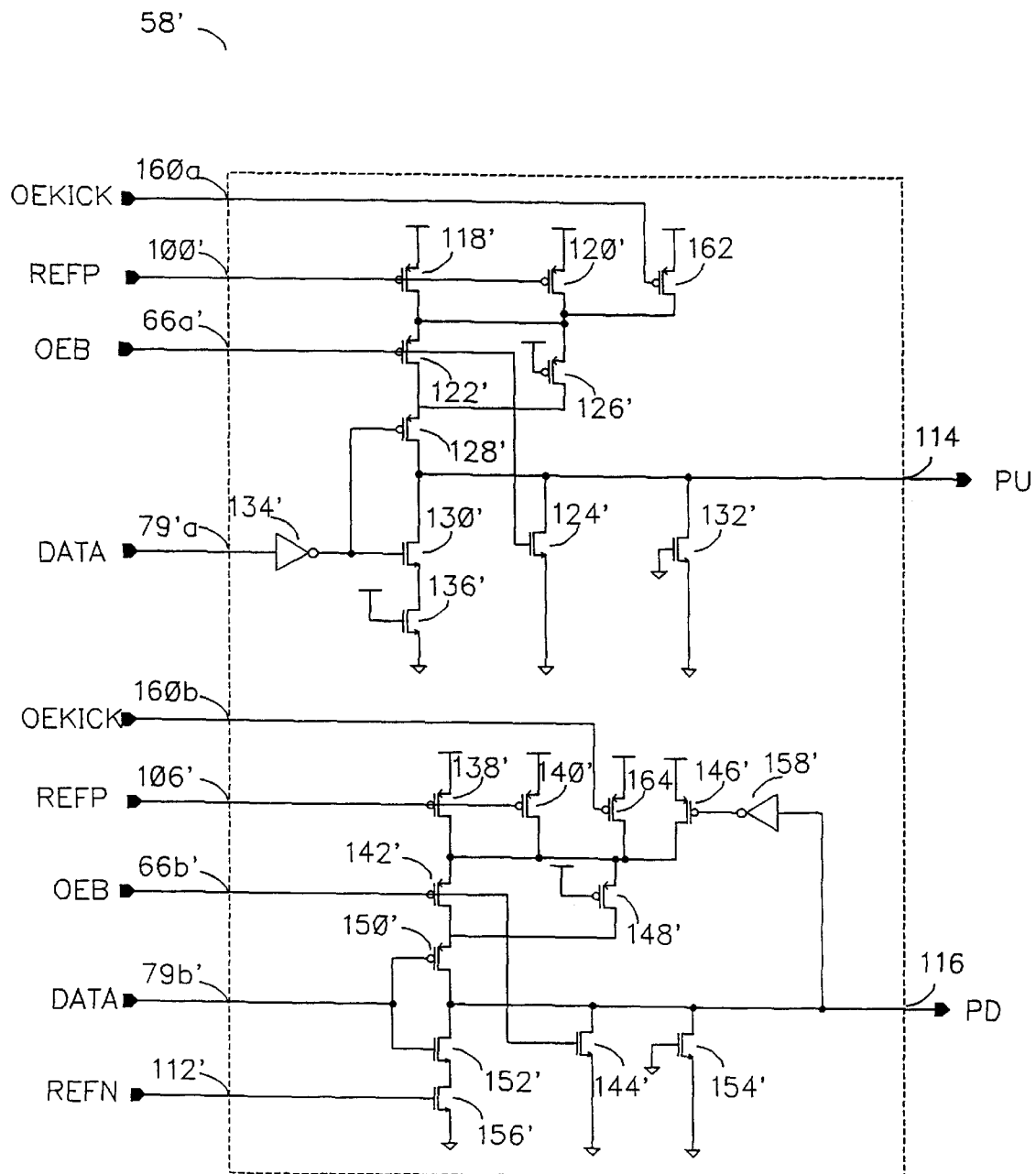
FIG. 5 is a schematic diagram of an alternate implementation of the output buffer shown in FIG. 3.

Referring to FIG. 5, an alternate circuit diagram of the output buffer 58' is shown. The components in FIG. 5 similar to those in FIG. 4 are shown using primed reference numbers. The output buffer 58' additionally comprises an input 160a, an input 160b, a transistor 162 and a transistor 164. The input 160a generally receives the kick signal OEKICK from the output 77 of the output enable kicker block 60. The kick signal OEKICK is generally presented to the gate of the transistor 162. The source of the transistor 162 is generally coupled to an input supply voltage (not shown). The drain of the transistor 162 is generally coupled between the drain of the transistor 120' and the source of the transistor 126'. Similarly, the input 160b receives the kick signal OEKICK from the output 77 of the output enable kicker block 60. The kick signal OEKICK is generally presented to the gate of the transistor 164. The source of the transistor 164 is generally coupled to an input supply voltage (not shown). The drain of the transistor 164 is generally coupled to the node that connects the drains of the transistors 138', 140' and 146' as well as the sources of the transistors 142' and 148'. The transistor 162 and the transistor 164 may provide an initial current boost that allows the outputs 114 and 116 to provide a faster signal rise response time. The faster response time is described in more detail in FIGS. 11A and 11B.

Figure 6:
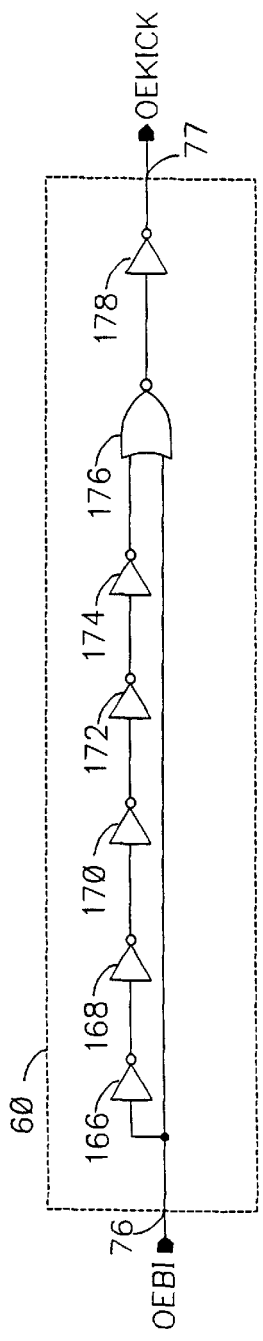
FIG. 6 is a schematic diagram of the output enable kicker shown in FIG. 3.

Referring to FIG. 6, the output enable kicker block 60 is shown in greater detail. The output enable kicker block 60 generally comprises an inverter 166, an inverter 168, an inverter 170, an inverter 172, an inverter 174, a NOR gate 176 and an inverter 178. The input 76 may receive a signal OEBI which generally represents the output of the output enable block 52. The signal OEBI is generally presented to a first input of the NOR gate 176 and to the inverter 166. The invertors 166, 168, 170, 172 and 174 are generally cascaded together and are generally presented to a second input of the NOR gate 176. The output of the NOR gate 176 is generally presented to the inverter 178. The output of the inverter 178 may present the kick signal OEKICK at the output 77 of the output enable kicker block 60. The invertors 166, 168, 170, 172, 174 and 178 in combination with the NOR gate 176 provide a one shot at the output 77. The output enable kicker block 60 functions as a one shot. Any other circuit which may function as a one shot may be substituted for the output enable kicker block 60.

The output enable kicker block 60 may provide a short duration signal that may be activated under either or both of two general conditions. The first condition may occur when the output signal (i.e., OEB in FIG. 1) received by a stand alone FIFO (e.g. the FIFO 12 only) or a pair out of an array of two or more cascaded FIFOs (e.g., the FIFO 12 in combination with the FIFO 14) makes a transition from an inactive to an active state. Referring back to FIG. 3, the output 77 of the output enable kicker block 60 may provide a signal that turns on the transistors 84 and 88 to provide an additional short duration boost in current at the inputs 80 and 82, respectively.

Figure 7:
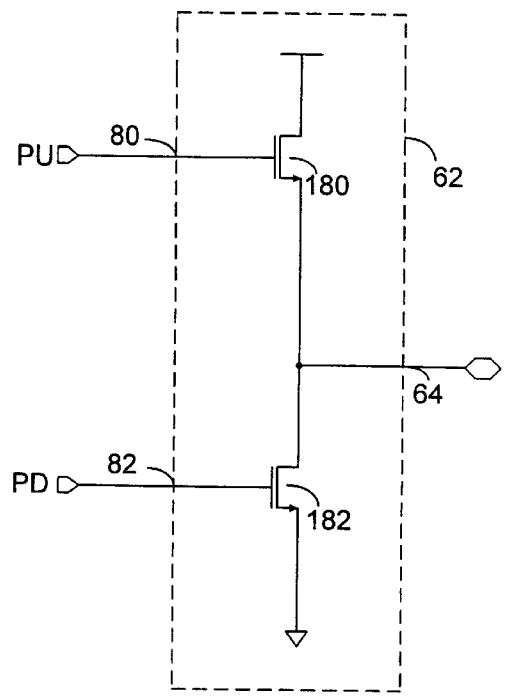
FIG. 7 is a schematic diagram of the output driver shown in FIG. 3.

The second condition may occur when two or more devices are cascaded and are each receiving a constant, valid output enable signal OEB. A boundary condition may occur when the first FIFO 12 stops driving the output bus 24 and the second FIFO 14 starts driving the output bus 24 with valid data. During this boundary condition, control may be switched from the first FIFO 12 to the second FIFO 14 as determined by the read clock RCLK, the read clock block 54, the expansion detection block 56, the output enable block 52 and the output buffer 58. During this transition, the first FIFO 12 turns off (driven low) both the signal PU and the signal PD while the FIFO 14 begins driving the common data output bus 24. Signal PU or the signal PD needs to be driven to a high state depending on the state of data to be driven on the common data output bus 24. If the data to be driven is high, the signal PU will be high and the signal PD will be low. If the data to be driven is low, the signal PU will be low and the signal PD will be high. The output enable kicker block 60, in combination with transistors 84, 86, 88 and 90, provide a short duration additional boost of current at the inputs 80 and 82 to enhance the rise time of either the signal PU or the signal PD. This additional current speeds up the first read data access from the FIFO 14. The input circuits of the output driver 62, to be described in connection with FIG. 7, are driven past their threshold voltages at a faster rate, thus realizing a performance enhancement. The duration of the boost can be adjusted to fit the design criteria of a particular application.

Referring to FIG. 7, the output driver 62 is shown in more detail. The output driver 62 generally comprises a transistor 180 and a transistor 182. The gate of the transistor 180 may receive the input 80. The drain of the transistor 180 may be coupled to the source of the transistor 182 as well as to the output 64. The gate of the transistor 182 may be coupled to the input 82. The drain of the transistor 182 may be coupled to ground. The source of the transistor 180 may receive an input supply voltage (not shown).

When the signal PJ is high, the output 64 may also be high. When the signal PD is high, the output 64 may also be low. The signal PU and the signal PD are mutually exclusive to the degree that both signals may not be high at the same time. However, both signals may be low at the same time which would drive the output 64 into a tri-state mode.

Figure 8:
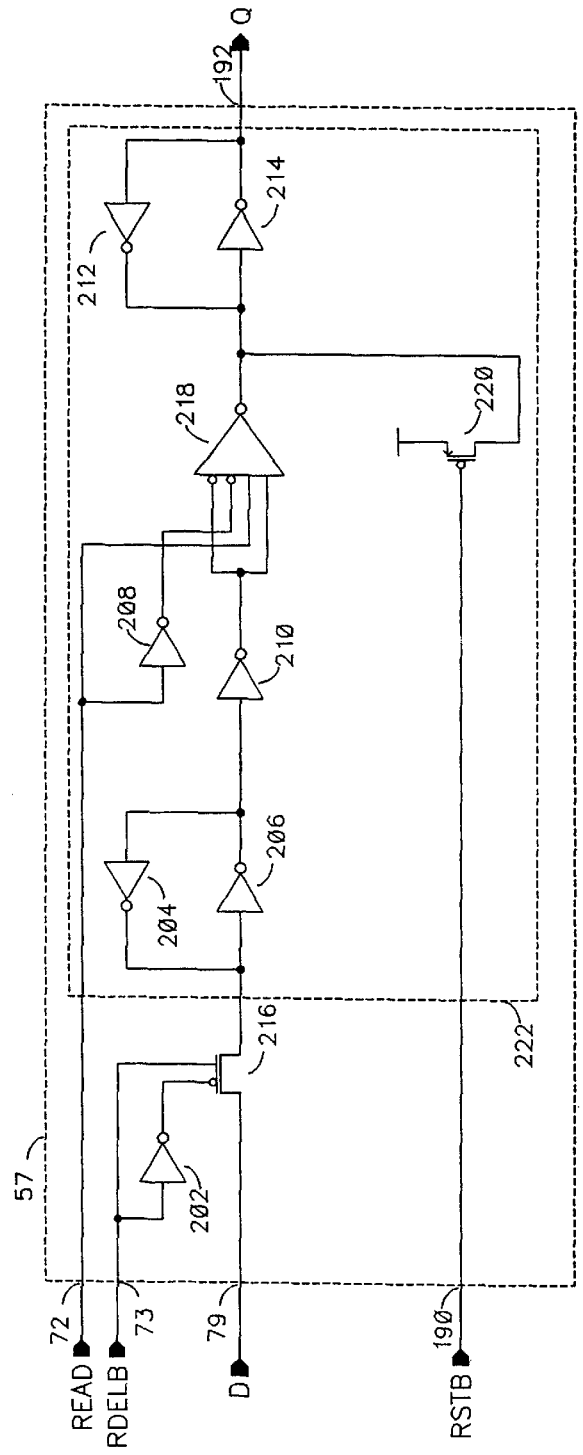
FIG. 8 is a schematic diagram of the output register shown FIG. 3.

Referring to FIG. 8, a circuit diagram of the output register block 57 is shown. The output register block 57 generally comprises an input 72, an input 73, an input 79 and an input 190. The output register block 57 generally presents an output 192. The output register block 57 generally comprises an inverter 202, an inverter 204, an inverter 206, an inverter 208, an inverter 210, an inverter 212, an inverter 214, a CMOS pass gate 216, an enabled inverter 218 and a transistor 220. The input 72 may receive a signal READ representing a signal derived from the read clock RCLK (not shown). The signal READ may follow the external read clock. The input 73 may receive a signal RDELB representing a delayed complement of the signal READ. The input 190 may receive a signal RSTB which may provide a reset function (i.e., drives each of the outputs to zero).

The CMOS pass gate 216 has a PMOS gate which generally receives the input 73 through the inverter 202 as well as a NMOS gate which generally receives the input 73. The input of the CMOS pass gate 216 generally receives the input 79. The output of the CMOS pass gate 216 is generally presented to the input of the inverter 206 as well as to the output of inverter 204. The output of the inverter 206 may be presented to the input of the inverter 210 as well as to the input of the inverter 204. The output of the inverter 204 may be presented to the input of the inverter 206 as well as to the output of the CMOS pass gate 216. The output of the inverter 210 may be presented to a p-data input as well as to a n-data input of the enabled inverter 218. The p-enabled input of the enabled inverter 218 may receive a signal from the input 72 through the inverter 208. The n-enabled input of the enabled inverter 218 may receive a signal from the input 72. The output of the enabled inverter 218 may be presented to the input of the inverter 214, the drain of the transistor 220 and the output of the inverter 212. The output of the inverter 214 may be presented to the output 192 as well as to the input of the inverter 212. The output of the inverter 212 may be connected to the input of the inverter 214, the drain of the transistor 220 and to the output of enabled inverter 218. The source of the transistor 220 may be connected to an input supply voltage (not shown). The gate of the transistor 220 may be connected to the input 190. A block 222 represents the output section of the output register block 57.

Figure 9:
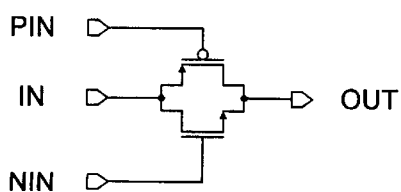
FIG. 9 is a circuit diagram of a CMOS pass gate.

Referring to FIG. 9, a CMOS pass gate is shown in greater detail. The PMOS gate input may be represented by the signal PIN while the NMOS gate input may be represented by the signal NIN. The input may be represented by the signal IN while the output may be represented by the signal OUT.

Figure 10:
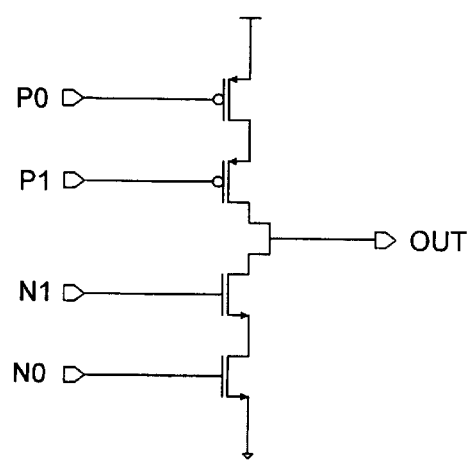
FIG. 10 is a circuit diagram of an enabled inverter.

Referring to FIG. 10, an enabled inverter is shown in greater detail. The p-data input may be represented by the signal P0, the p-enabled input may be represented by the signal P1, the n-enabled input may be represented by the signal N1 and the n-data input may be represented by the signal N0. The output of the enabled inverter may be represented by the signal OUT.

Figure 11A:
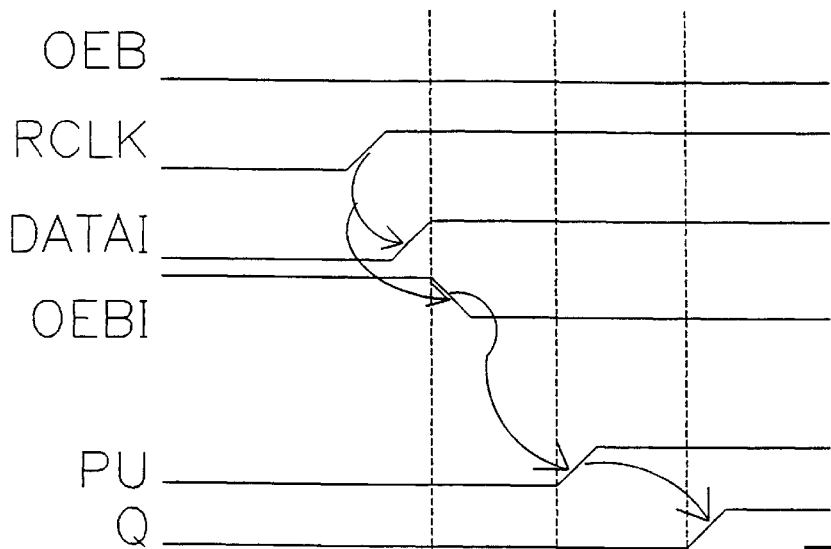
FIG. 11A is a timing diagram graphically illustrating the rise time of the output of the FIFOs of FIG. 1.
Figure 11B:
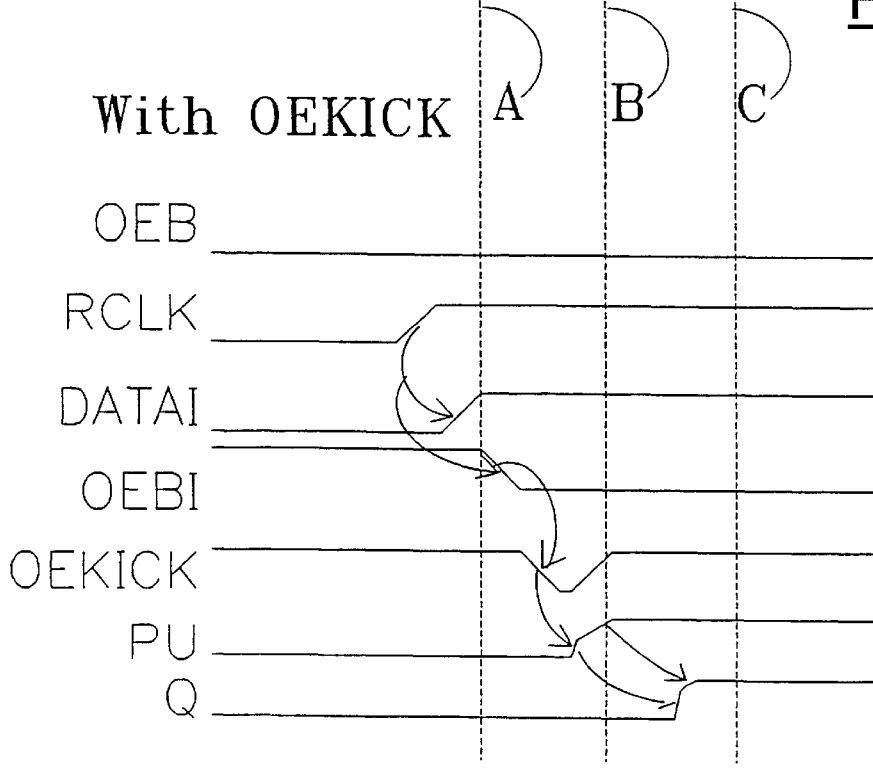
FIG. 11B is a timing diagram graphically illustrating the rise time of the output of the present invention.

Referring to FIGS. 11A and 11B, a timing diagram of the present invention (FIG. 11B) versus the FIFOs of FIG. 1 (FIG. 11A) is shown. The vertical-lines A, B and C are provided to show the timing relationships between the two sets of timing signals. The signal OEBI, the signal RCLK and the signal DATA1 are shown to have a similar timing relationship between the two diagrams. FIGS. 11A and 11B illustrate the rise time when accessing high data. A similar timing arrangement is present when accessing low data where the signals DATAI and Q are inverted and the signal PU is replaced with the signal PD. The signal PU in the FIG. 11A is shown to start rising at the second vertical line B. The signal PU in the diagram 113 has already risen to its maximum value at the second vertical line B. The output signal Q is shown to begin rising at the third vertical line in FIG. 11A. The output signal Q has completed its rise and stayed at its maximum value for a short duration before the third vertical line C in FIG. 11B. The OEKICK circuit produces the extra signal boost to raise PU or PD past the threshold voltage of the transistors in the output driver at a much quicker rate. A multi-slope PU or PD signal may dramatically improve the read data access time while having little affect on the output noise generated. The timing relationships shown in FIGS. 11A and 11B generally occur at OE accesses or boundary read accesses. The multi-slope PU or PD signals may be implemented as a strong slope, followed by a weaker slope, followed by a weak slope. Such a combination may provide the OEKICK circuit the extra signal boost to pass the threshold voltage of the transistors while allowing the circuit to scale back to a weaker slope to avoid excessive noise problems.

While the invention has been particularly shown and described with reference to preferred embodiments thereof, it will be understood by those skilled in the art that various changes in form and details may be made without departing from the spirit and scope of the invention.

I claim:

1. A circuit comprising:
   means for generating a pull-up signal (PU) and a pull-down signal (PD);
   means for generating an output signal in response to said PU signal and said PD signal;
   means for enhancing the speed of said output signal generating means in response to an output enable signal, said means for enhancing comprising (i) gate means having a first and a second input, said first input being connected to said pull-up and pull signal generating means and (ii) delay means connected to said second input, said gate means for receiving said output enable signal; and
   means for providing said output enable signal to said means for generating said PU and PD signals and said means for enhancing the speed of said output signal generating means.

2. The circuit according to claim 1 wherein said gate means comprises a NOR gate.

3. The circuit according to claim 1 wherein said means for enhancing comprises kick signal generating means.

4. The circuit according to claim 3 wherein said kick signal generating means comprises two or more transistors connected in series.

5. The circuit according to claim 3 wherein said kick signal generating means comprises two or more transistors connected in parallel.

6. The circuit according to claim 3, wherein said gate means comprises means for amplifying said PU and PD signals.

7. The circuit according to claim 6 wherein said means for amplifying comprises two or more transistors.

8. A device selected from the group consisting of first-in first-out buffers, static random access memories, dual port memories, content addressable memories, CACHE memories, dynamic random access memories and TAG memories, comprising the circuit of claim 1.

9. The circuit according to claim 1, further comprising:
   a first and second transistor coupled between said speed enhancing means and said output signal generating means.

10. The circuit according to claim 4, wherein said two or more transistors comprise an inverter.

11. The circuit according to claim 5, wherein said kick signal generating means comprises an odd number of inverters.

12. A method for enhancing access in a buffer of a memory comprising the steps of:
    (a) generating a pull-up and a pull-down signal;
    (b) generating an output signal in response to said pull-up and pull-down signals;
    (c) generating an output enable signal; and
    (d) enhancing the speed of said output signal using (i) a gate having a first and second input, said first input connected to said pull-up and pull-down signal and (ii) a delay connected to said second input.

13. The method according to claim 12 further comprising the steps of combining said first data signal with a pull-up signal and combining said second data signal with a pull-down signal.

14. A circuit comprising:
    a pull-up (PU) circuit;
    a pull-down (PD) circuit;
    an output driver circuit configured to generate an output signal in response to the outputs of said PU and PD circuits;
    an enable circuit configured to generate an output enable signal to be presented to said PU circuit, said PD circuit and said output driver circuit; and
    an output signal speed enhancing circuit including (i) a gate circuit having a first and second input, said first input connected to said pull-up and pull-down circuits and (ii) a delay circuit connected to said second input of said gate circuit, said gate circuit configured to enhance the speed of the output driver circuit in response to said output enable signal.

15. The circuit according to claim 14 wherein:
    said output signal speed enhancing circuit comprises (a) a NOR gate configured to receive said output enable signal and (b) one or more logic devices connected to said NOR gate.

16. The circuit according to claim 15 wherein said logic device(s) are capable of delaying a signal to said NOR gate.

17. The circuit according to claim 16 wherein at least one of the PU and PD circuits are characterized by one or more timing slopes capable of enhancing data access time in a memory buffer connected thereto.

18. The circuit according to claim 15, wherein said speed enhancing circuit further comprises:
    an amplifier circuit capable of providing an increased current to said PU and PD circuits.

19. The circuit according to claim 14, further comprising:
    a first and second transistor coupled between said output signal speed enhancing circuit and said output drive circuit.

20. The circuit according to claim 14 wherein said output speed enhancing circuit comprises two or more transistors connected in series.

21. The circuit according to claim 20, wherein said two or more transistors comprise an inverter.

22. The circuit according to claim 21, wherein said output speed enhancing circuit comprises an odd number of inverters.

* * * * *